United States Patent [19]

Dubuisson

[11] Patent Number: 4,775,503

[45] Date of Patent: Oct. 4, 1988

[54] PROCESS FOR THE MANUFACTURE OF AN INTERCONNECTING SUBSTRATE FOR ELECTRONIC COMPONENTS

[75] Inventor: Jacques Dubuisson, Paris, France

[73] Assignee: Interconnexions Ceramiques, Courbevoie, France

[21] Appl. No.: 885,953

[22] Filed: Jul. 10, 1986

[30] Foreign Application Priority Data

Jul. 16, 1985 [FR] France .................... 85 10871

[51] Int. Cl.$^4$ ............................................. C04B 35/64
[52] U.S. Cl. ........................................ 264/61; 264/65; 156/89; 29/830
[58] Field of Search ............... 264/61, 65; 156/89; 29/830

[56] References Cited

U.S. PATENT DOCUMENTS

| | | | |
|---|---|---|---|
| 4,234,367 | 11/1980 | Herron et al. | 264/61 |
| 4,301,324 | 11/1981 | Kumar et al. | 174/52 FP |
| 4,641,425 | 2/1987 | Dubuisson et al. | 264/61 |

FOREIGN PATENT DOCUMENTS 0132790 2/1985 European Pat. Off. .
0145599 6/1985 European Pat. Off. .

*Primary Examiner*—James Derrington
*Attorney, Agent, or Firm*—Dennison, Meserole, Pollack & Scheiner

[57] ABSTRACT

A process is disclosed for forming an interconnecting substrate for electronic components based on a cordierite ceramic, the substrate having a relatively small dielectric coefficient, allowing use in ultra high frequency applications. In one embodiment, the substrate is prepared from a powder which is sintered at approximately 980 degrees, allowing coatings of silver heated in an oxidizing atmosphere, or copper heated in a reducing atmosphere. In another embodiment, the powder is sintered at approximately 1350° C., allowing coatings of a palladium base heated in an oxidizing atmosphere or molybdenum or tungsten base heated in reducing atmosphere.

7 Claims, No Drawings

PROCESS FOR THE MANUFACTURE OF AN INTERCONNECTING SUBSTRATE FOR ELECTRONIC COMPONENTS

BACKGROUND OF THE INVENTION

The present invention concerns a process for the manufacture of an interconnecting substrate for electronic components, as well as the substrate which is thus obtained.

Such a substrate is formed of a sintered stack of sheets of dielectric material of which at least some carry internal conductor designs, this substrate presenting conductive projections for connection to the terminals of the component(s), with at least one internal layer provided with conductive tracks to assure the interconnection of layer to layer and with these projections according to preestablished design, using metal-coated connections.

Such a substrate structure is described for example in EP-A-0 No. 145,599, "Interconnecting Aluminum Oxide Substrate for Electronic component, and Process for its Manufacture", filed in the name of EUROFA-RAD-EFD.

SUMMARY OF THE INVENTION

One of the purposes of the present invention is to realize an interconnecting substrate presenting a very small relative dielectric coefficient, particularly allowing it to be used in ultra high frequency applications; in fact, in these areas, the propagation depends directly upon $1/\sqrt{K}$, wherein K is the relative dielectric coefficient. For satisfactory operation, the K value must be between 4 and 5.5.

Another purpose of the invention is the realization of a substrate which presents a coefficient of small expansion in addition to excellent dielectric properties, while still preserving excellent mechanical properties.

With reference to this, it is desirable that the range of this coefficient be from $1 \times 10^{-6}$ to $3 \times 10^{-6}$, the value adapted to the silicon coefficient ($3 \times 10^{-6}$) of the silicon chips which may be set on this substrate.

With reference to this, it has been established that cordierite ceramics could allow for these different objectives.

A "cordierite type" composition has a ternary formula and will comprise in the range of 60 to 50% $SiO_2$, 5 to 20% $MgO$ and 20 to 40% $Al_2O_3$ (here and hereinafter, except when indicated to the contrary, all proportions indicated will be weight proportions).

More precisely, the process of the invention comprises the following steps:

(a) preparing a slip by mixing a cordierite ceramic powder with an organic binder, in the presence of a solvent;
(b) casting unfired sheets of ceramic of this slip;
(c) drying the sheets to evaporate the solvent;
(d) serigraphing the internal conductive designs by means of a first metal-coating ink, formed of a metal pigment, an organic vehicle and a solvent;
(e) drying the ink;
(f) drilling unfired connections,
(g) filling the connections with a second metal-coating ink formed of a metal pigment, a ceramic charge, an organic vehicle and a solvent;
(h) stacking the various sheeets provided with their respective serigraphed designs;
(i) optionally drilling holes for fixation of the connection studs, with optional metal coating of the walls by means of the same metal-coating ink as is used for the metal coating of the connections (but with a smaller viscosity);
(j) compressing the stack into a homogenouse block;
(k) removing residual organic materials; and
(l) sintering the ceramic.

In a first method of implementation, the ceramic powder is a powder which can be sintered at low temperature, the sintering carried out at a maximum temperature of below 1000° C. It will be shown that the sintering can be realized as desired in either an oxidizing or reducing atmosphere, and the metal pigments of the metal-coating inks must then be adapted to the oxidizing or reducing character of the sintering atmosphere.

In a second method of implementation, the ceramic powder is a powder which can be sintered at high temperature, the sintering carried out at a maximum temperature of at least 1300° C. Here, too, the sintering can be realized either in reducing atmosphere or in oxidizing atmosphere, and for metal-coating inks are selected appropriately for the atmosphere.

Other features and advantages will become apparent from the detailed description hereinafter of the two aforementioned embodiments.

DESCRIPTION OF THE PREFERRED EMBODIMENTS

A. MANUFACTURE OF AN INTERCONNECTING SUBSTRATE WITH LOW TEMPERATURE SINTERING

As used herein, "low temperature" means a maximum sintering temperature below 1050° C., and generally below 980° C.

1. Preparation of the Cordierite Powder which can be Sintered at Low Temprature

A process for the preparation of such a powder for example comprises the following steps:

(a) preparing an alcoholic solution mixed with aluminum and silicon salt, the salts being soluble in alcohol or in a solvent which is miscible with alcohol;
(b) preparing a solution of a magnesium salt soluble in alcohol or in a solvent which is miscible with alcohol or else in its corresponding acid;
(c) preparing a solution by mixing the two preceding solutions with vigorous stirring to obtain a homogenous solution;
(d) adding a hydrolyzing agent in the form of a weak base which is totally volatile in the preceding solution, which leads to the formation of a gel;
(e) heat treating the gel which is obtained for at least 24 hours at a temperature of at least 450° C.; and
(f) heat treating the powder obtained at a temperature of between 450° and 900° C. for at least 6 hours.

Preferably, the powder heat treatment stage is preceded by an oxygented water treatment stage at a temperature of between 60° and 100° C., then filtering the suspension which is obtained.

The aluminum may be introduced in the form of an alkyl oxide which is soluble in alcohol and is of the following formula:

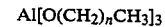

wherein n represents a whole number between 0 and 4.

Butyl oxide of aluminum of the following formula is advantageous for use in this case:

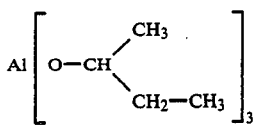

Other alkyl oxides, such as ethyl oxide, propyl oxide, and isopropyl oxide of aluminum, also lead to good results. Organic salts or organic complexes such as aluminum acetate, aluminum benzoate, aluminum acetyl acetonate, aluminum stearate may also be used.

Generally speaking, all of the salts or organic complexes which are soluble in alcohol or soluble in a solvent which is miscible with alcohol are suitable for realization of the invention. Among these are salts which are in the form of mineral salts, such as aluminum nitrate Al(NO$_3$)$_3$ which is hydrated or not hydrated in alcoholic or acetic solution, or aluminum chloride AlCl$_3$ in alcoholic solution. The hydrochloric acid is eliminated and the corresponding aluminum alkyl oxide is generated by bringing this last solution to a boil for a sufficient length of time.

Any aluminum salts which are soluble in alcohol or in a solvent which is miscible with alcohol are generally suitable for realization of the invention.

Silicon may be introduced in the form of an alkyl oxide which is soluble in alcohol, of the following formula:

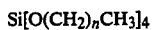

wherein n represents a whole number between 0 and 4.

The silicon ethyl oxide of the following formula can advantageously be used:

Other silicon alkyl oxides, such as propyl oxide, isopropyl oxide and butyl oxide also lead to good results. Silicon may also be provided in the form of esters or salts such as silicon tetracetate (CH$_3$COO)$_4$Si which is soluble in acetic acid, or even a quaternary ammonium silicate. Any esters or salts which are soluble in alcohol or in a solvent which is miscible with alcohol, or even in their corresponding acid, is generally suitable for realization of the invention.

Magnesium may be introduced in the form of either an ester or a salt. Magnesium acetate Mg(CH$_3$COO)$_2$ which is hydrated or not hydrated in anhydrous acetic acid is advantageous for use. Other esters can be used in the same manner, such as magnesium benzoate, propionate, oleate, and stearate. Any ester or salt of magnesium which is soluble in alcohol or in a solvent which is miscible with alcohol, or even in its corresponding acid, is generally suitable for realization of the invention. Magnesium may also be added in the form of mineral salts, such as hydrated or not hydrated magnesium nitrate or chloride in alcoholic solution.

The mixed solution of aluminum and silicon salts is prepared in the presence of an alcohol which can, for example, be isopropanol.

Hydrolysis which leads to the formation of the gel takes place at a temperature of between 20° and 80° C., preferably between 20° and 50° C. with a weak base, such as hydrated hydrazine NH$_3$—NH$_2$, H$_2$O. Any weak base containing only volatile ions, such as diluted ammonia, hydroxylamine, and ammonium salts of weak acids (ammonium carbonate, ammonium carbamate) is generally suitable for realization of this phase of the process.

However, hydrated hydrazine is preferable, because this plays the role of "equalizer" of dynamic hydrolysis. This role exerted by the hydrated hydrazine on the dynamics of hydrolysis is particularly important when aluminum and silicon alkyl oxides and magnesium acetate are used as starting products, which have different dynamics of hydrolysis; aluminum alkyl oxide is easily hydrolyzed, silicon alkyl oxide with greater difficulty, and magnesium acetate dissolves in water. The hydrated hydrazine allows realization of partial or total hydrolysis of the alkyl oxides, thus in accordance with speeds of gelling and bonding of the Mg$^{2+}$ ion to the gel.

For this purpose, it is desirable that the water be totally eliminated from the solution, because the slightest trace of water would cause uncontrolled hydrolysis of the most fragile alkyl oxide, the aluminum alkyl oxide. However, it is to be noted that the presence of small quantities of water is no trouble if the aluminum alkyl oxide is replaced by aluminum nitrate.

The heat treatment to which the gel is subjected following hydrolysis is carried out at a temperature equal at the most to 450° C., and generally between 200° and 450° C., for at the most 24 hours, and generally for between 1 and 2 hours, the rate of temperature rise being for example between 50° and 100° per hour. The purpose of this heat treatment is to eliminate the greatest part of the solvents, the water and the hydrazine. Following this treatment, the powder which is obtained is slightly yellowish in color.

The powder is optionally washed in preferably 20–30% hydrogen peroxide at a temperature of between 60° and 100° C. This treatment with hydrogen peroxide is for the purpose of eliminating the last organic radicals which can be bonded to the metals Al, Si or Mg.

The hydrogen peroxide treatment can be optionally replaced by mixing the slip with air at a temperature of between 80° and 100° C.

It will be noted that this step of the hydrogen peroxide treatment can be deleted if the application for which the powder is intended is not disturbed by the presence of traces of carbon, resulting from the pyrolysis of organic materials which are not totally eliminated by calcination during heat treatment.

Following washing with hydrogen peroxide, the powder is subjected to another heat treatment which takes place at a temperature of between 450° and 900° C., and generally between 550° and 700° C. for at the most 6 hours, generally between 30 and 120 minutes, so as to eliminate the constituent and hydration water.

A relatively coarse powder is obtained, which, following a slight crushing, gives a powder which is constituted of grains of which the dimensions are between 0.01 and 10 microns, and is white in color.

2. Preparation of the Slip

Once the powder is obtained, a slip is prepared by mixing approximately 1 part by weight powder and 1.5 parts by weight of an organic binder. The organic binder is of traditional composition; it can, for example, comprise:

polyvinyl alcohol (approximately 5%);

platicizer (approximately 15%) such as polyethylene glycol, ethylene glycol, "cellosolve" (monoethyl ether of ethylene glycol);

appropriate additives: wetting agent, deflocculant, dispersant, antistatic agent, etc; and aqueous solvent.

As a variation, it is also possible to use the following composition:

polyvinylbutyral;

plasticizer such as dibutyl phthalate or the like; additives; and organic solvent such as trichloroethylene, trichloroethane, methylethylketone or ethyl alcohol.

3. Shaping of the Unfired Ceramic

Then sheets of unfired ceramic are realized by casting this slip, then drying in the sheets to allow evaporation of the solvent, and cutting to the desired dimensions.

4. Realization of the Component

Once the sheets of unfired ceramic are prepared, their surfaces are serigraphed with the respective internal designs by means of a first metal-coating ink formed of a metal pigment, an organic vehicle (for example ethylcellulose in 5 to 10% proportion) and a solvent (for example terpineol).

In the case wherein the sintering will be realized under reducing or neutral atmosphere ($H_2$, moist $H_2$, $N_2$, Ar or He), the metal pigment of the ink is selected from the group comprising copper and its alloys of at least 80% copper, nickel and its alloys, silver and its alloys, copper coated with silver or nickel, or even perhaps gold.

Following drying of the ink (for instance by infrared drying), the various sheets will be superposed to form the stack.

Then the punching or drilling of the unfired connections is carried out to assure the interconnection. This operation is preferably realized by punching with a matrix-punch for sheets smaller than 300 millimicrons thick, and by drilling with a high speed bit (driven at over 30,000 rpm) guided by a reconnaissance device controlled by computer, for sheets of greater thickness.

The connections are then metallized; for that, a small quantity of a metal-coated ink of particular composition is deposited, which, in addition to the metal pigment, is also charged to assure conductivity, comprising a small quantity of ceramic (less than 5% by weight) to assure the creation of a "skeleton" and to allow adherence.

The ink can be deposited in different manners:

(1) by forcing it into the connections by a matrix-punch method (the ink having been placed beforehand in the form of a separte dry sheet, of uniform thickness equal to the thickness of the ceramic);

(2) by "serigraphy" (by silksreen or by simple or reverse stenciling of the sheet); or (3) simply by deposition of a drop calibrated by a distributor device controlled by computer.

Discharge studs or collars are generally formed at the outlets of the connections on the sides of the substrate by supplementary metal deposition. For this purpose, in a first variation, the metal of the corresponding pigment is selected from the group comrpising silver, palladium, silver-palladium alloys, copper and copper-nickel or copper-aluminum alloys, and gold. This depositing is realized by serigraphy with an ink containing the metal pigment with a glass or ceramic paste added (preferbly a cordierite) which can be sintered at low temperature, the ink thus deposited being fired in a reducing atmosphere, either in the course of a supplementary firing step, or by complementary sintering at the same time as the ceramic.

The metal can also be introduced in the pigment in the form of an oxide which can be reduced by firing, for example in the form of copper oxide $Cu_2O$; in this last case, the copper oxide can be the major constituent of the glass paste.

Alternatively, the discharge studs or collars can be vapor deposited in a vacuum or cathode sprayed following masking, the proper metal being selected from the group comprising nickel, and copper-nickel and chrome-nickel alloys, as well as gold and copper.

In either case, the deposit which is thus formed can be recharged by electrolytic or chemical processing.

If necessary, it is also possible to drill holes to affix discharge conductors, which will avoid the need for seams on the substrate; the drilling to an appropriate diameter will be effected by means of a bit driven at high speed, in the same manner as for the connections. The walls of these holes will optionally be metal coated (before or following firing of the substrate), and in this case the same metal-coating ink will be used as that which served for coating the connections, but with a smaller viscosity.

In the case wherein the sintering is realized in oxidizing atmosphere, the progression of the different steps is identical.

For selection of the metal pigment:

(1) for realization of the internal conductor designs, the metal is selected from the group comprising silver and its alloys with at least 75% silver, and gold;

(2) for the connections, the pigment is the same, with addition of a ceramic charge;

(3) for the discharge studs, the pigment is the same, with addition of a glass or ceramic paste; in this case, it is possible to proceed with a second firing in either reducing or oxidizing atmosphere. Alternatively, it is possible to provide a vapor deposition in a vacuum, in a manner identical to that explained above.

II. MANUFACTURE OF A SUBSTRATE WITH SINTERING AT HIGH TEMPERATURE

As used herein, "high temperature" means maximum sintering temperature above 1300° C., generally on the order of 1370° C.

1. Preparation of the Cordierite Powder

The powder is prepared by mixing magnesia, alumina and silica in respective weight proportions of approximately 43.1%–28.4%–28.5%, so as to define a molar composition near that of the cordierite.

The following additives may be added to this powder:

(1) for sintering in reducing or neutral atmosphere, molybdenum, niobium or chrome oxides;

(2) for sintering in oxidizing atmosphere, titanium or calcium oxides.

2. Preparation of the Slip Placed in Ceramic Form and Realization of the Component The evolution of the operation is the same as in the preceding case.

The same type of binder can be added to the powder as that used for sintering at low temperature.

For the pigment of the serigraphy ink of the conductor designs on the sheets, it is possible to select:

(1) for sintering in reducing atmosphere, palladium and its alloys, nickel and its alloys, tungsten, molybdenum and their alloys, or any other conductive compound which is compatible with the maximum firing temperature.

(2) for sintering in oxidizing atmosphere, palladium and its alloys.

The metal-coating ink of the connections uses the same pigments, with addition of a ceramic charge, particularly a charge of cordierite.

For the finishing of the discharge studs of the collars of the connections, it is possible to use the same metal pigments as in the case of sintering at low temperature, moreover with tungsten and its alloys, molybdenum and its alloys (particularly manganese), as well as nickel and its alloys, and the firing is then carried out in a reducing or neutral atmosphere.

As in the case of low temperature sintering, the vapor deposition can optionally be carried out in a vacuum or by cathode spraying, with electrolytic or chemical recharging.

What is claimed is:

1. Process for the manufacture of an interconnecting substrate for electronic components, comprising the steps of:
   (a) preparing a slip by mixing a cordierite ceramic powder with an organic binder, in the presence of a solvent, said cordierite ceramic powder being prepared by mixing an alcoholic solution of an aluminum salt soluble in alcohol or in an alcohol-miscible solvent and a silicon salt soluble in alcohol or in an alcohol-miscible solvent, with a solution of a magnesium salt in alcohol, or a solvent which is miscible with alcohol or its corresponding acid, hydrolyzing said mixture of solutions with a weak base which is totally volatile to form a gel, heat treating the gel at a temperature of 450° C. for at least 24 hours to form a powder, and heat treating said powder at 450°–900° C. for at least six hours to obtain said cordierite ceramic powder;
   (b) casting sheets of unfired ceramic from said slip;
   (c) drying the sheets with evaporation of the solvent;
   (d) serigraphing internal conductor designs on the dried sheets by means of a first metal-coating ink, formed of a metal pigment, an organic vehicle and a solvent;
   (e) drying the ink;
   (f) drilling unfired connections into the sheets with dried ink;
   (g) filling the connections with a second metal-coating ink formed of a metal pigment, a ceramic charge, an organic vehicle and a solvent;
   (h) stacking a plurality of sheets provided with respective serigraphed designs;
   (i) compressing the stacked sheets into one homogenous block;
   (j) evacuating the residual organic materials from the block; and
   (k) sintering the ceramic in the block at a temperature below 1050° C.

2. Process for the manufacture of an interconnecting substrate for electronic components as in claim 1, wherein the sintering is realized in reduced or neutral atmosphere, the metal pigments of the metal-coating inks being selected from the group consisting of copper and its alloys with at least 80% copper, nickel and its alloys, copper coated with silver or nickel, silver and its alloys, and gold.

3. Process for the manufacture of an interconnecting substrate for electronic components as in claim 1, wherein the sintering is realized in an oxidizing atmosphere, the metal pigments of the metal-coating inks being selected from the group consisting of silver and its alloys with at least 75% silver, and gold.

4. Process for the manufacture of an interconnecting substrate for electronic components as in claim 1, additionally comprising the step of forming collars or discharge studs at the outlets of the connections, with a metal pigment selected from the group consisting of silver, palladium, silver-palladium alloys, copper, copper-nickel alloys, copper-aluminum alloys, and gold, by depositing by serigraphy, an ink containing the metal pigment with a glass or ceramic paste which can be sintered at low temperature added, and firing the ink thus deposited in a reducing atmosphere.

5. Process for the manufacture of an interconnecting substrate for electronic components as in claim 1, additionally comprising the step of forming collars or discharge studs at the outlets of the connections with a metal selected from the group consisting of nickel, copper-nickel alloys, chrome-nickel alloys, gold and copper, by vapor depositing in a vacuum or cathode spraying, following masking.

6. Process for the manufacture of an interconnecting substrate for electronic components as in claim 1, additionally comprising the step of forming collars or discharge studs at the outlets of the connections with a proper metal by vapor depositing in a vacuum or cathode spraying, following masking.

7. Process for the manufacture of an interconnecting substrate for electronic components as in claim 1, additionally comprising the step of drilling fixation holes for connection studs and metallizing said fixation holes, after said stacking step.

* * * * *